(12) United States Patent
Furuta

(10) Patent No.: US 7,473,974 B2
(45) Date of Patent: Jan. 6, 2009

(54) SEMICONDUCTOR CIRCUIT DEVICE INCLUDING A PROTECTION CIRCUIT

(75) Inventor: Hiroshi Furuta, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 744 days.

(21) Appl. No.: 10/856,999

(22) Filed: Jun. 1, 2004

(65) Prior Publication Data
US 2004/0238894 A1 Dec. 2, 2004

(30) Foreign Application Priority Data
Jun. 2, 2003 (JP) ............... 2003-156170

(51) Int. Cl.
*H01L 23/62* (2006.01)
(52) U.S. Cl. .................. 257/360; 257/630
(58) Field of Classification Search ............ 257/360, 257/630
See application file for complete search history.

(56) References Cited

U.S. PATENT DOCUMENTS 6,097,066 A * 8/2000 Lee et al. ............ 257/355
6,204,536 B1 * 3/2001 Maeda et al. ............ 257/355
6,352,882 B1 3/2002 Assaderaghi et al.
6,690,067 B2 * 2/2004 Ker et al. ............ 257/355

FOREIGN PATENT DOCUMENTS

JP 6-112482 4/1994
JP 11-126899 5/1999

* cited by examiner

*Primary Examiner*—Howard Weiss
(74) *Attorney, Agent, or Firm*—McGinn IP Law Group, PLLC

(57) ABSTRACT

A protection element comprises a ring-shape gate electrode, an N+ drain region inside the ring-shape gate electrode, an N+ source region outside, and a shield plate electrode. The ring gate and source regions are connected to ground via a through-hole, and the drain region is connected to an external pad. The shield plate electrode is connected to ground or to a power supply. Element isolation is achieved by the shield plate electrode, without forming a LOCOS or other element isolation oxide layer. By this means, blocking of thermal conduction by an oxide layer can be avoided to improve the heat dissipation and ESD resistance of the protection element.

20 Claims, 4 Drawing Sheets

SEMICONDUCTOR CIRCUIT DEVICE INCLUDING A PROTECTION CIRCUIT

BACKGROUND OF THE INVENTION

1. Field of the Invention

This invention relates to a semiconductor circuit device and, more particularly, to a semiconductor circuit device comprising a protection element to protect the circuit from ESD and so on.

2. Description of a Related Art

In a semiconductor circuit device, it is necessary to electrically isolate each element in order that no electrical interference occurs between the plurality of elements formed on the substrate or within the substrate. There are increasingly strict demands for semiconductor circuit devices with higher integration levels, greater functionality, faster speed, and lower power consumption, and various element isolation techniques have been proposed in the past. One of the most representative element isolation methods is the LOCOS (LOCal Oxidation of Silicon) structure. In the LOCOS method, elements are isolated by forming a thermal oxide layer between elements on the substrate, using a nitride film as a mask. By performing such oxidation, the oxidation progresses toward the silicon substrate interior, and a buried oxide layer (LOCOS) is formed.

The STI (Shallow Trench Isolation) method is known as another element isolation technique. In the STI method, a groove or trench is formed in silicon by dry etching, and after filling the trench with $SiO_2$, CMP (Chemical Mechanical Polishing) is used to remove $SiO_2$ formed outside the trench. An isolation structure is thereby formed in which a flat oxide layer is buried only in the trench. Compared with a LOCOS structure, STI makes possible smaller isolation widths, thus greatly contributing to higher device densities.

The SOI (Silicon On Insulator) structure is known as an isolation technique which includes the substrate itself. A SOI structure comprises a device formed in a silicon thin film (SOI layer) on an insulating layer. In a bulk CMOS device, a P/N-type MOS transistor is isolated by a well layer; but an SOI-MOS device is isolated by the Si supporting substrate and a buried oxide layer, as shown in FIG. 8. A device in which the SOI layer is made thin and the body area below the channel is completely depleted is called a fully depleted SOI device; a device having an area which is not depleted to the bottom of the body area is called a partially depleted SOI device. FIG. 8 shows one example of the structure of a partially depleted SOI device. In this structure, each element is isolated by, for example, a LOCOS oxide layer, and the operating area (SOI layer) is completely isolated by an insulator.

The SOI structure is effective for solving problems such as latch-up and parasitic junction capacitance, and greatly contributes to increases in device density and speed and to reduced power consumption. However, the buried oxide layer causes some problems. While the buried oxide layer provides electrical isolation, it also impedes thermal conduction, greatly reducing heat dissipation. This effect cannot be ignored, particularly for elements with high current densities.

An NMOS device with the gate connected to ground (GGNMOS, Gate-Grounded NMOS) is known as a protective element which prevents internal breakdown in a circuit due to ESD (Electro-Static Discharge). ESD gives rise to a surge voltage pulse between an external connection pad and the internal circuit due to contact of the semiconductor circuit device with, for example, human skin or equipment. A GGNMOS element prevents application of a surge voltage to a gate electrode of the internal circuit by passing a current between the external pad and the ground line as a result of breakdown between source and drain. In the SOI structure of a protective element, there is the problem that thermal conduction is impeded by the buried oxide layer, so that the temperature of the ESD protective element rises sharply due to the surge current, and the ESD withstand voltage of the ESD protection element itself is reduced.

Consequently, proposals have been made to resolve the heat dissipation problems of SOI elements (see for example U.S. Pat. No. 6,352,882). Polysilicon plugs penetrating the buried oxide layer are formed on the substrate, connecting the MOSFET device region with the silicon substrate of an opposite polarity type. The polysilicon plugs are in contact with the MOSFET device source or drain, and comprise the function of diffusing positive or negative ESD. At the same time, the polysilicon plugs comprise the function of diffusing heat, and can prevent thermal breakdown of the element. However, such a structure has the problem of involving complicated manufacturing processes.

On the other hand, a shield plate isolation method is known as a technique for electrically isolating elements (see for example Japanese Unexamined Patent Application Publication No. 11-126899). This technique provides, for example, an oxide layer and a shield plate electrode so as to surround the element. By applying a reverse bias voltage to the shield plate, extension of the depletion layer outside the region surrounded by the shield plate electrode is prevented, and electrical isolation of elements is achieved.

However, such shield plate electrodes have not been studied from the standpoint of thermal problems on an SOI substrate (or in SOI elements). In particular, the problem of thermal breakdown in elements used for input protection, and their relation to shield plate electrodes, have not received any study. Further, the devices disclosed in the above references comprise straight gate electrodes intersecting with the shield plate electrode; there is a considerable possibility that this intersection portion may also constitute a major problem with respect to ESD. Or, because the diffusion layer connected to the external terminal is isolated by the shield plate electrode, the discharge path cross-sectional area is small, and the amount of ESD is small.

In a transistor used as a protection element, in order to render uniform the current distribution, a gate electrode structure comprising a waffle-shape pattern layout has been proposed (see for example Japanese Unexamined Patent Application Publication No. 6-112482). By means of a waffle-shape pattern gate electrode, the current density of the breakdown current flowing between source and drain is made uniform, so that the electrostatic breakdown intensity of the protection element can be enhanced. However, the problems of such gate electrode structures and of drops in electrostatic resistance due to heat of the protection element have not yet received any study.

SUMMARY OF THE INVENTION

This invention has been devised in light of the above problems of the prior art, and has as an object the provision of a semiconductor element structure enabling improvement of the withstand voltage of a protection circuit.

To these ends, according to a first embodiment of the present invention, there is provided a semiconductor circuit device comprising a protection circuit that comprises a ring gate to which a first potential is applied; a first impurity diffusion layer formed inside the ring gate; a second impurity diffusion layer formed outside the ring gate; and a shield electrode formed so as to surround the second impurity diffusion layer and to which a second potential is applied, wherein one of the first and second impurity diffusion layers is connected to a circuit to be protected, and another impurity diffusion layer receives the first potential. This structure enables to improve the withstand voltage of the protection circuit.

In the first embodiment, it is preferred that the first potential is a ground potential, and the second potential is a ground potential or a power supply potential. Or, it is preferred that the first potential is a power supply potential, and the second potential is a ground potential or a power supply potential. This enables effective element isolation.

In the semiconductor circuit device of the first embodiment, an insulating layer is preferably formed below the first and second impurity diffusion layers. This structure enables to improve the protection circuit of the semiconductor circuit device having an oxide layer below a silicon layer.

In the first embodiment, a diffusion layer of an opposite conductivity type to the second impurity diffusion layer is preferably formed outside the shield electrode. This enables effective element isolation.

The semiconductor circuit device according to the first embodiment preferably further comprises another protection circuit comprising the component elements of the protection circuit according to Claim 1, wherein an insulating layer for electrical isolation is not formed between the protection circuit and the another protection circuit. This enables to improve the heat dissipation from the protection circuit.

The semiconductor circuit device according to the first embodiment preferably comprises another protection circuit comprising the component elements of the protection circuit according to Claim 1; a first shield electrode between circuits and a second shield electrode between circuits formed between the protection circuit and the another protection circuit; and a diffusion layer of an opposite conductivity type to the silicon layer, formed in the silicon layer between the first shield electrode between circuits and the second shield electrode between circuits. This structure enables to improve electrical isolation between the protection circuits.

It is further preferred that the protection circuit and the another protection circuit are connected between an external pad and an internal circuitry and further comprises two shield electrodes between circuits, positioned between the internal circuitry and the protection circuit, and between the internal circuitry and the other protection circuit; and, a diffusion layer of an opposite conductivity type to the silicon layer, formed in the silicon layer between the two shield electrodes between circuits. This enables to improve electrical isolation between the internal circuit and the protection circuit. Alternatively, it is further preferred that potentials are applied to the first and second shield electrodes between circuits so as to collect carriers causing injection between the protection circuit and the another protection circuit. Further, it is preferred that potentials are applied to the diffusion layer of an opposite conductivity type to the silicon layer so as to collect carriers causing injection between the protection circuit and the other protection circuit. This structure enables to improve isolation between the circuits.

In the first embodiment, it is preferred that the protection circuit comprises a plurality of circuit components connected in parallel and each of the plurality of circuit components comprises a ring gate to which a first potential is applied; a first impurity diffusion layer formed inside the ring gate; a second impurity diffusion layer formed outside the ring gate; and a shield electrode formed so as to surround the second impurity diffusion layer and to which a second potential is applied, wherein one of the first and second impurity diffusion layers is connected to a circuit to be protected, and another impurity diffusion layer receives the first potential. This structure enables to improve the withstand voltage of the protection circuit. The shield electrode may be shared by adjacent circuit components.

According to a second embodiment of the present invention, there is provided a semiconductor circuit device, comprising a plurality of protection circuits, comprising a first protection circuit; a second protection circuit, different from the first protection circuit; and, a shield electrode for element isolation, formed between the first protection circuit and the second protection circuit, without forming an element isolation insulating layer between the first protection circuit and the second protection circuit. This structure enables to improve the heat dissipation of the protection circuit to improve the withstand voltage.

In the second embodiment, it is preferred that the semiconductor circuit device comprises an external pad and internal circuitry, and a shield electrode is formed between the first protection circuit and the internal circuitry. This enables to improve element isolation of the protection circuit.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Applicable embodiments of this invention are explained below. The following are explanations of embodiments of this invention, but this invention is not limited to these embodiments. The following descriptions are abbreviated or simplified as appropriate to clarify the explanation. Moreover, each of the elements in the following embodiments can be easily altered, added to, or modified within the scope of the invention by a person skilled in the art. In the figures, the same symbols indicate component elements which are effectively the same, and unnecessary explanations are omitted in the interest of clarity.

Embodiment 1

Figure 1:
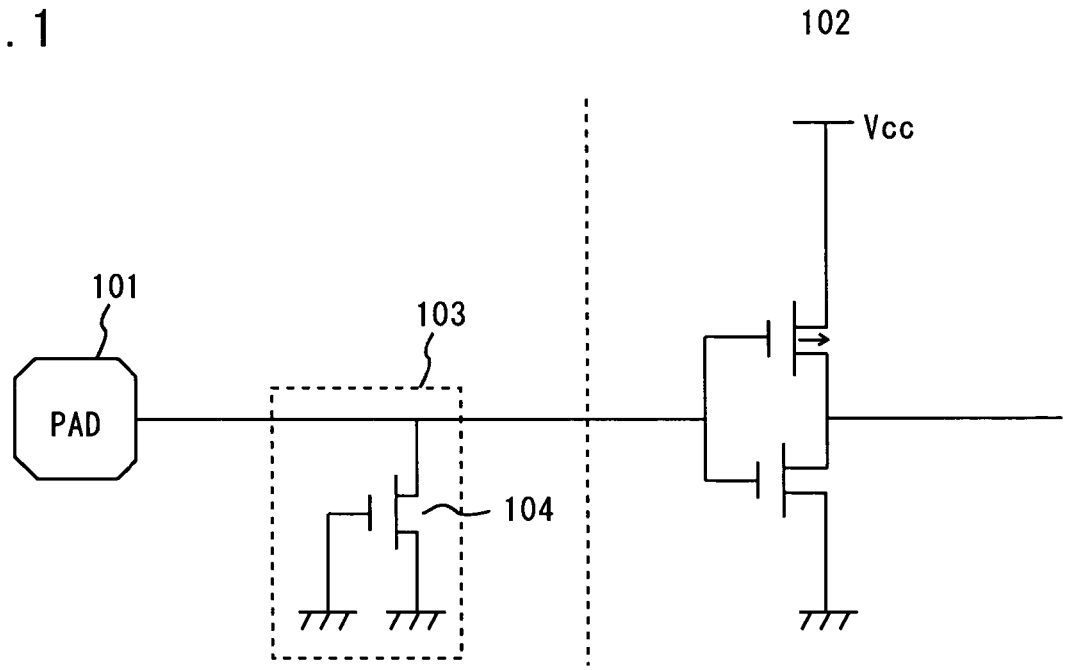
FIG. 1 is a circuit diagram showing the circuit configuration of a protection circuit according to the first embodiment of the present invention.

FIG. 1 is a circuit diagram showing a circuit configuration to which this invention can be applied. A semiconductor element structure or semiconductor circuit configuration of this invention is appropriate for an ESD (Electro-Static Discharge) input protection circuit or ESD input protection element formed using an MMOS or PMOS structure. In the following explanation, the example of an NMOS structure is employed in explaining an embodiment of this invention, but this invention can also be applied to a PMOS structure. A PMOS structure comprises a configuration which, in essence, is the opposite conductivity type to the semiconductor layer in the following explanation. Also, connections in the following explanation are adequate if an electrical connection is made, and direct physical connection is not required.

The following explanation of an embodiment takes as an example an input protection circuit between an external input pad and internal circuitry; but this invention is not limited to a protection circuit for ESD protection between a pad and internal circuitry, and it should be evident to those skilled in the art that this invention can be applied to power supply protection elements inserted between a power supply and ground, or to protection circuits or protection elements used in other areas or in other modes. In the following, for clarity of explanation, the terms "element" or "circuit" are used; the concept of circuit comprises a plurality of elements, or an element electrically connected to other elements. Similarly, an element may comprise a plurality of elements. The same component can be both an element and a circuit.

FIG. 1 shows the circuit configuration of an input protection circuit connected between a pad and the input portion of an internal circuit. The input protection circuit shown in FIG. 1 comprises an external input pad 101 to which external signals are input, an internal circuit 102 of a semiconductor circuit device, and an input protection circuit 103 connected in parallel with the internal circuit. The internal circuit 102 of this example comprises a CMOS (Complementary Metal Oxide Semiconductor) inverter circuit as an input circuit portion.

The input protection circuit 103 comprises a GG (Gate-Grounded) NMOS element 104 as an input protection element. The gate and source (drain) of the GGNMOS element 104 are connected to a ground line, and the drain (source) is connected to the external input pad 101 and the internal circuit 102. The drain can for example be connected through a resistor to the external input pad 101. The ground potential is given as a low potential; the potential value is determined appropriately through the circuit design. When a high voltage is applied due to ESD (Electro-Static Discharge), the GGNMOS element 104 turns on the parasitic bipolar transistor comprising the source (emitter)-substrate (base)-drain (collector), to pass current between the external pad 101 and ground line. By this means, the application of a surge voltage to the gate electrode of the internal circuit 102 can be prevented. When forming the protection element using a PMOS structure, the power supply potential $V_{cc}$ is supplied to the source (drain) and gate, and the external input pad is connected to the drain (source).

Figure 2:
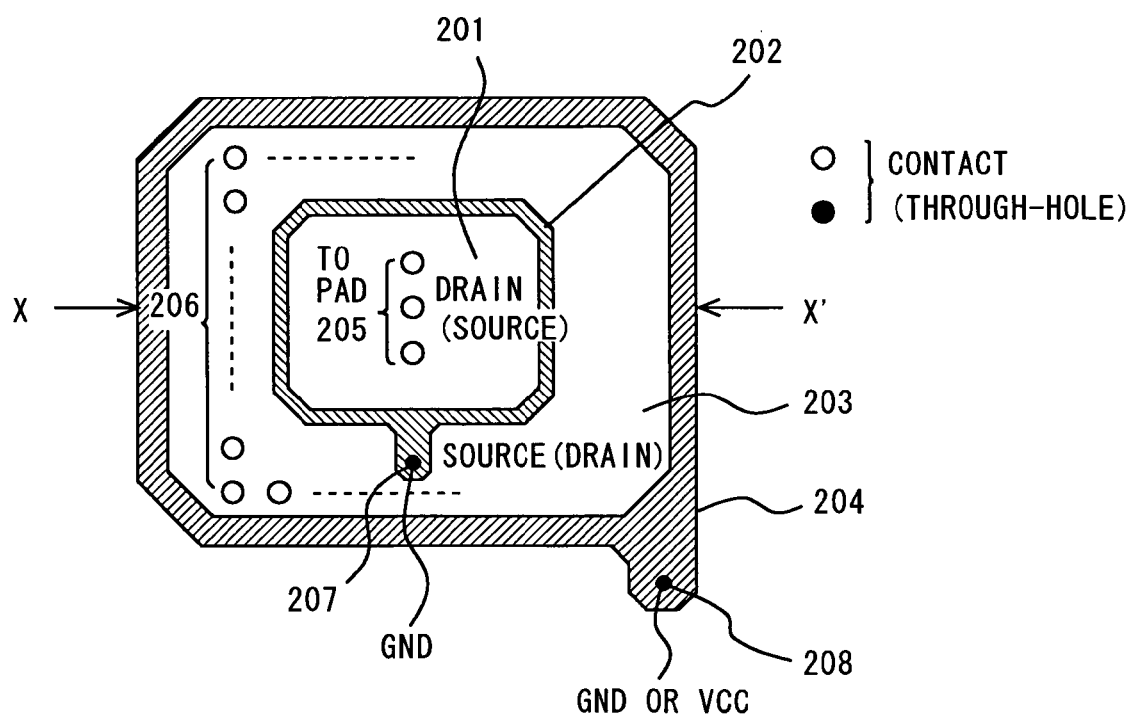
FIG. 2 is a top plan view showing the upper-surface structure of the protection element according to the first embodiment of the present invention.

FIG. 2 is a plane view showing the upper-surface structure of the GGNMOS element 104 as the input protection element of this embodiment. The GGNMOS element 104 in FIG. 2 comprises the drain (or source) region 201, the gate electrode 202, the source (or drain) region 203, and the shield plate electrode 204. In the following, an explanation is given in which the region 201 is a drain region and the region 203 is a source region. Insulating layers (not shown) are formed between the electrode and silicon layer, and on each of the components.

A plurality of contact holes 205 are formed in the insulating layer of the drain region 201 to provide connections to the external pad 101. The drain of the GGNMOS element 104 is connected via these contact holes 205 to the external pad 101 and internal circuit 102. A plurality of contact holes 206 are formed in the insulating layer of the source region 203 to provide connections to the source of the GGNMOS element 104 and to ground. Connections via through-holes can typically be made using an aluminum wiring layer.

A contact hole 207 is formed in the insulating layer on the gate electrode 202 to provide connection to the gate electrode 202 and ground. A contact hole 208 is formed in the insulating layer on the shield plate 204 to provide connection to the shield plate electrode 204 and ground or a power supply line. The shield plate electrode 204 can be connected to ground or to $V_{cc}$. In order to further simplify the circuit structure, it is preferable that the shield plate electrode 204 be connected to ground. By fixing the shield plate electrode 204 at a prescribed potential, electrical isolation of each element can be provided.

The gate electrode 202 is formed in a ring shape. The drain is formed inside the ring-gate electrode 202, and the source is formed outside the ring-gate electrode 202. The gate electrode 202 of this example is effectively formed in a rectangular shape, with each corner chamfered. By chamfering the corners, unevenness in the current density between source and drain at the corners can be suppressed. It is preferable that the gate electrode 202 be formed in a polygonal shape with eight or more vertices, or in a circular shape. By this means, the current density between source and drain can be made more uniform.

The gate length L of the ring-gate electrode 202 is selected to be the optimal value for a protection element. The through-hole 207 is formed in the protruding portion of the gate electrode 202, protruding on the side of the source connected to ground. Because the gate electrode 202 and source are both connected to ground, problems in cases where the through hole 207 penetrates the gate electrode 202 can be prevented.

The shield plate electrode 204 is formed in a ring shape, and surrounds a MOS structure. That is, the shield plate electrode 204 surrounds a drain (source) region 201, gate electrode 202, and source (drain) region 203. The source (drain) region 203 is formed between the shield plate electrode 204 and gate electrode 202. The electrode length L of the shield plate electrode 204 can be set to be longer than the gate electrode 202. The GGNMOS structure in this example can be fabricated using various processes. For example, the shield plate electrode 204 and gate electrode 202 can be formed in the same polysilicon formation process, or using different polysilicon formation processes.

The GGNMOS structure can be formed such that the thicknesses of the gate insulating layer and the insulating layer under the shield plate electrode are different. A first insulating layer is formed over the entire substrate, and the shield plate electrode is formed on this. After patterning the shield plate electrode, the first insulating layer is removed. Then, the gate insulating layer is formed over the entire surface, and a MOSFET gate electrode is formed. Here, the thickness of the insulating layer below the shield plate electrode can be set independently of the gate insulating layer thickness, for increased flexibility of design. Conversely, the gate insulating layer and gate electrode can be formed first, after which the shield plate electrode insulating layer and shield plate electrode are formed.

Figure 3:
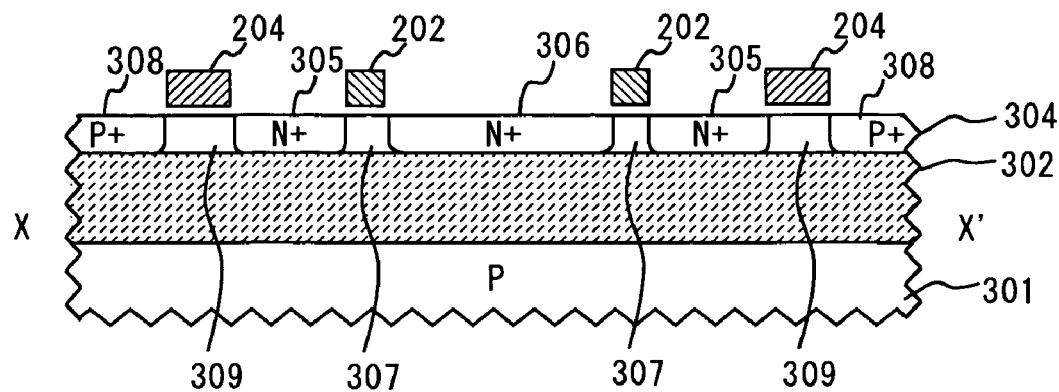
FIG. 3 is a sectional view showing the cross-sectional structure of the protection element according to the first embodiment of the present invention.

FIG. 3 is a cross-sectional view showing the structure of the GGNMOS element 104, and shows the cross-sectional structure along the arrows X-X' in FIG. 2. In order to clarify the explanation, a structure is shown in which some components such as a gate oxide layer, interlayer insulating layer, and a metal wiring layer on the substrate are omitted or are simplified. The GGNMOS element 104 in FIG. 3 comprises the P silicon substrate 301, the buried oxide layer 302, and the SOI (Silicon On Insulator) layer 304. The SOI layer 304 (hereafter as "silicon layer") has impurities implanted in advance, and is a P⁻ layer with comparatively low impurity concentration.

An N⁺ source diffusion layer 305 and N⁺ drain diffusion layer 306 are formed in the silicon layer 304. The N⁺ source diffusion layer 305 is formed in the silicon layer inside the gate electrode 202, and the N⁺ drain diffusion layer 306 is formed outside. A P⁻ silicon region 307, in which the N channel is to be formed, is between the N⁺ source diffusion layer 305 and the N⁺ drain diffusion layer 306, and below the gate electrode 202. Further, a P⁺ diffusion layer 308 is formed in the silicon layer 304 outside the shield plate electrode 204. A P⁻ silicon region 309 is between the P⁺ diffusion layer 308 and N⁺ source diffusion layer 305, below the shield plate electrode 204. In the GGNMOS element 104 of this embodiment, the element is not isolated by a LOCOS (LOCal Oxidation of Silicon) oxide layer or STI (Shallow Trench Isolation) oxide layer.

Electrical isolation of an element in the protection circuit of this embodiment is performed by a shield plate electrode 204 surrounding the element and fixed at a prescribed potential. It is preferable that ground potential or the power supply potential $V_{cc}$ be provided to the shield plate electrode 204. In this structure, an oxide layer to electrically isolate the element is not formed in the top layer of the buried oxide layer 302, so that heat dissipation from the GGNMOS element 104 can occur efficiently, and a substantial heat dissipation effect can be realized. As a result, the ability of the GGNMOS element 104 to withstand ESD can be improved. Also, the GGNMOS element 104 comprises a ring-shape gate electrode 202, and by lowering the current density between source and drain, heating of the element can be suppressed. Thus, by combining a ring-gate electrode and a ring-shape shield plate electrode, a decline in the resistance to ESD of the GGNMOS element 104 due to heating can be suppressed.

FIG. 3 shows an example of a fully depleted SOI-MOS element, in which the buried oxide layer is formed directly below the diffusion region, and the body region below the channel is fully depleted. This invention is not limited to fully depleted SOI structures, but can also be applied to partially depleted SOI structures or to so-called bulk-structure semiconductor circuit devices different from SOI structures. In this configuration, because an element isolation oxide layer is not required in the diffusion layer plane, in the direction parallel to the substrate surface, of the protection element, heat dissipation in the protection element can be improved.

From the standpoint of thermal conduction, this invention provides a significant advantage for SOI structures and particularly for fully depleted SOI-MOS structures, and it is particularly appropriate that the invention be applied to such structures. In FIG. 3, a P⁺ diffusion layer is formed outside the shield plate electrode 204, but this may be a high impurity concentration layer in the SOI layer or an N type impurity diffusion layer. The potential provided to the shield plate electrode 204 is selected appropriately according to the structure.

Embodiment 2

Figure 4:
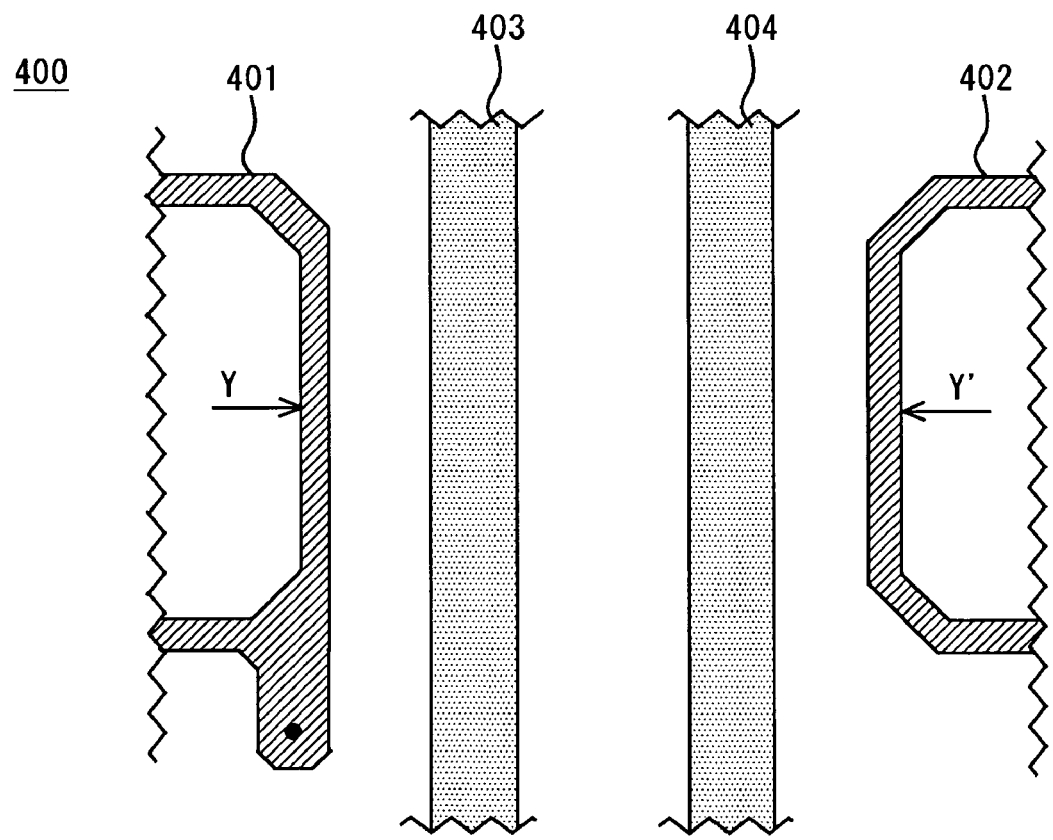
FIG. 4 is a top plan view showing the upper-surface structure of a protection circuit according to the second embodiment of the present invention.

FIG. 4 is a plane view showing the upper-surface structure of the protection circuit 400 in a second embodiment. The protection circuit of this embodiment further comprises, between adjacent GGNMOS elements, a shield plate electrode between elements. The shield plate electrode between elements can suppress the effect of carrier injection between elements and so on. The protection circuit 400 in FIG. 4 comprises the shield plate electrode 401 of a first protection element, the shield plate electrode 402 of a second protection element, a first shield plate electrode 403 between elements, and a second shield plate electrode 404 between elements. The first and second shield plate electrodes between elements are fixed at a prescribed potential; it is preferable that either ground potential or the power supply potential $V_{cc}$ be supplied. It is more preferable that the power supply potential $V_{cc}$ be supplied. The first and second shield plate electrodes between elements can either be formed as physically continuous electrodes, or can be formed as isolated electrodes. The same potential need not be supplied to these two electrodes.

Figure 5:
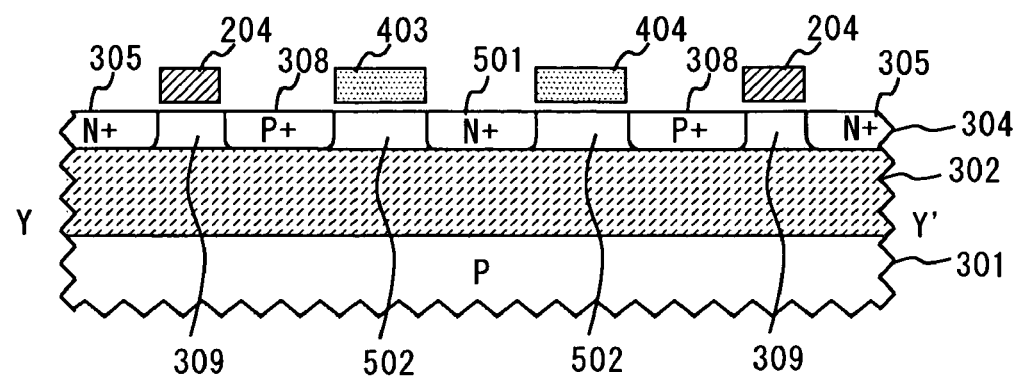
FIG. 5 is a sectional view showing the cross-sectional structure of the protection circuit according to the second embodiment of the present invention.

FIG. 5 is a cross-sectional view showing the structure of the protection circuit 400, and shows the cross-sectional structure of the portion indicated by the arrows Y-Y' in FIG. 4. An N⁺ diffusion layer 501 is formed in the silicon layer 304 between the first and second shield plate electrodes 403 and 404. The P⁻ silicon layer 502 is between the N⁺ diffusion layer 501 and P⁺ diffusion layer 308, below the shield plate electrode between elements 403 between the first and second elements. It is preferable that ground potential or the power supply potential $V_{cc}$ be provided to the shield plate electrodes 403, 404 between the first and second elements. It is preferable that the power supply potential $V_{cc}$ be supplied to the N⁺ diffusion layer 501. By providing the power supply potential $V_{cc}$, electrons can be collected.

Two shield plate electrodes are positioned between the protection elements, and by forming, in the silicon layer between the shield plate electrodes, a diffusion layer of the opposite conductivity type to the silicon layer, injection of carriers occurring upon surge discharge by the other protection element can be suppressed. By this means, element isolation can be made more effective. Through the above structure to isolate elements from each other, the pitch between protection elements can be reduced. In particular, by providing a potential to collect carriers to the shield plate electrode or to the diffusion layer of an opposite conductivity type, the effect to suppress carrier injection can be further increased.

The first and second shield plate electrodes between elements can be formed by a process similar to that for the shield plate electrodes of protection elements. FIG. 4 shows a diffusion layer and shield plate electrodes between elements which are formed between protection elements; it is preferable that the diffusion layer and shield plate electrodes between elements be formed in the perimeter of the region in which protection elements are formed, including the space between the internal circuitry and protection elements, to surround protection elements. When there are scribe lines, a diffusion layer and shield plate electrodes between elements need not be formed on the scribe line side.

By forming, between the internal circuitry and protection elements, diffusion layers and shield plate electrodes between elements, element isolation oxide layers between the internal circuitry and protection elements can be omitted, and heat dissipation can be improved. Or, providing the N⁺ diffusion layer within the N well is effective. The protection circuit structure of this invention can comprise two or more diffusion layers and shield plate electrodes between elements positioned on both sides of the diffusion layers.

Embodiment 3

Figure 6:
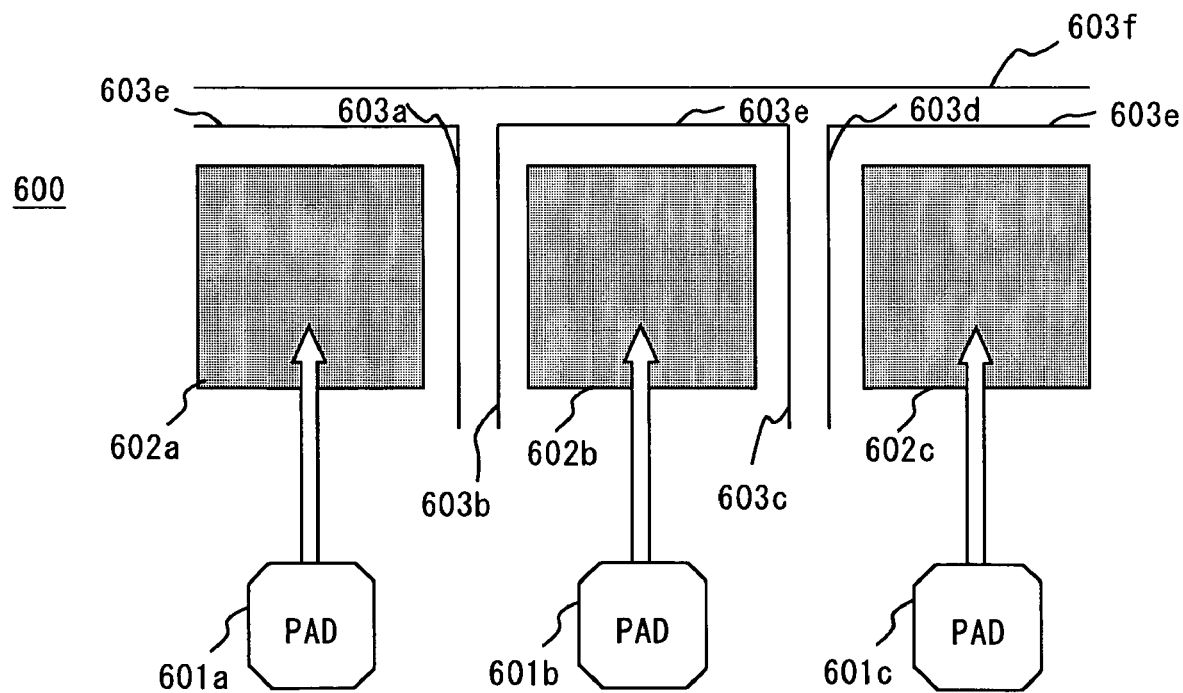
FIG. 6 is a top plan view showing the upper-surface structure of a protection circuit according to the third embodiment of the present invention.

FIG. 6 is a plane view showing the configuration of a protection circuit 600 in a third embodiment. The protection circuit 600 of this embodiment comprises a plurality of protection element groups, in which a plurality of protection elements are connected in parallel. The protection circuit 600 comprises an external pad 601, which comprises three external connection pads, 601a to 601c in this example. The protection circuit 600 also comprises a protection element group 602 in which a plurality of protection elements are connected in parallel, which comprise three protection element groups, 602a to 602c in this example. The protection element groups 602a to 602c correspond to external connection pads 601a to 601c, respectively, and each protection element group functions as an internal circuit protection element connected to an external connection pad, or as a protection element. The number of protection elements comprised by a protection element group 602 is determined appropriately according to the design.

The protection circuit 600 also comprises a shield plate electrode 603 between the protection element groups, formed between protection element groups. In this example, two pairs of shield plate electrodes, 603a and b and 603c and d, are formed between the protection element groups. Further, two shield plate electrodes 603e and f are formed between the protection element group 602 and the internal circuitry. By comprising a diffusion layer of the opposite conductivity type to the SOI layer and shield plate electrodes enclosing this diffusion layer, injection from adjacent protection element groups can be suppressed. Further, by forming, between the internal circuitry and protection element groups, diffusion layers and shield plate electrodes between elements, electrical isolation can be made more effective. And, the isolation oxide layers between the internal circuitry and protection element groups can be eliminated, so that heat dissipation can be improved. The cross-sectional structure of the lower portion of the shield plate electrodes is substantially the same as the structure shown in FIG. 5.

It is preferable that ground potential, and more preferably the $V_{cc}$ potential, be supplied to the shield plate electrodes 603 and diffusion layers between electrodes via throughholes (not shown). A plurality of the protection elements shown in FIG. 2 are effectively connected to each of the external pads 601. By this means, the source-drain current density in each MOS element can be reduced, so that the amount of heating in protection circuits can be decreased. And by connecting a plurality of protection elements in parallel, the current density uniformity can be improved compared with a protection element comprising a single large ring-gate and shield plate electrode.

Figure 7:
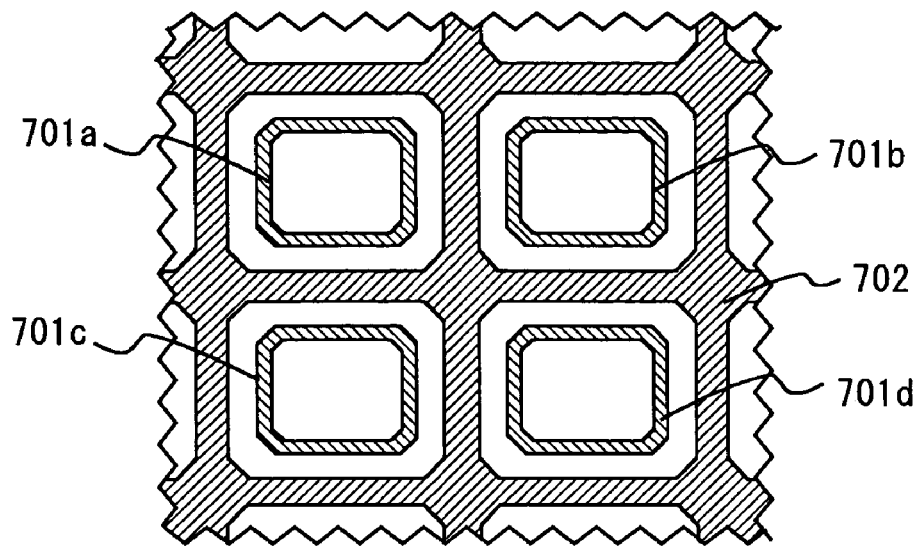
FIG. 7 is a top plan view showing the sectional structure of the protection circuit according to the third embodiment of the present invention.
Figure 8:
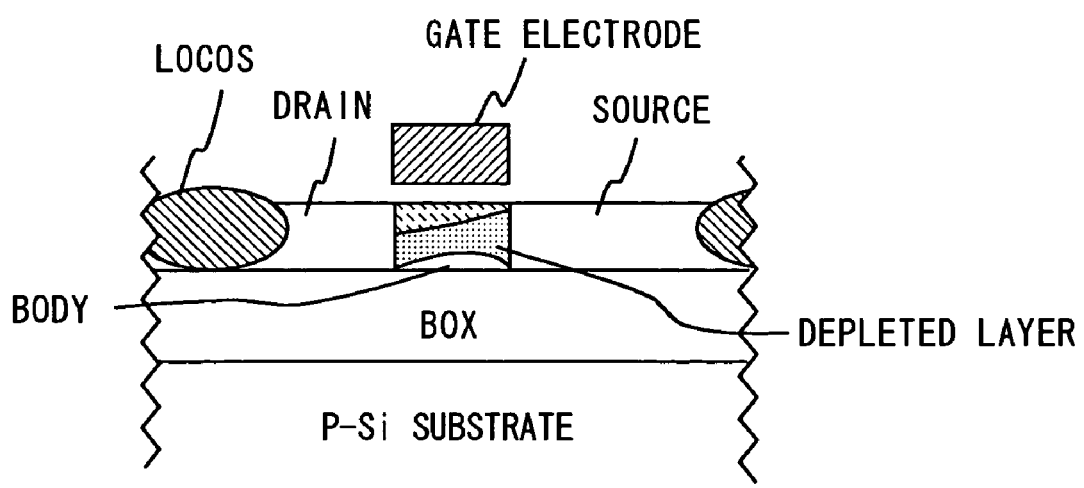
FIG. 8 is a sectional view showing the cross-sectional structure of a protection element according to a conventional technique.

FIG. 7 is a plane view showing in part the configuration of a protection element group 602. The protection element group 602 shown in FIG. 7 comprises a ring-shape gate electrode 701 and a lattice-shape shield plate electrode 702. In this example, a configuration is shown in which gate electrodes 701 are positioned in the apertures of the lattice-shape shield plate electrode 702. In FIG. 7, four ring-gate electrodes 701a to d are shown. All of the protection elements of the protection element group 602 are connected in parallel, all of the ring-gate electrodes 701 are connected by an aluminum wiring layer, and ground potential is supplied. The shield plate electrode 702 is shared by adjacent elements. It is preferable that ground potential be supplied to the shield plate electrodes 702.

In an NMOS structure, $N^+$ diffusion layers are formed in the silicon layers inside and outside a ring-gate electrode 701. The silicon layer below the ring-gate electrode 701 and the shield plate electrode 702 is a $P^-$ layer. A $P^+$ diffusion layer is typically formed in the silicon layer outside the protection element group 602. In this embodiment, adjacent protection elements share the shield plate electrode 702, but each protection element may comprise a different shield plate electrode.

For example, by arranging protection elements having the structure shown in FIG. 2 and FIG. 3 on a substrate, a protection element group can be formed. The shield plate electrodes of the protection elements are connected by a top-layer aluminum wiring layer, and the aluminum wiring layer is connected to ground potential. It is preferable that a diffusion layer for protection circuit isolation and a shield plate electrode between elements be formed to surround the region in which a protection element group is formed, including the space between the internal circuitry and protection element group. By this means, electrical isolation of the protection element group can be made more effective.

As described in the foregoing, this invention can provide a semiconductor circuit structure which improves the withstand voltage of a protection circuit.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor circuit device, comprising:
   a protection circuit, the protection circuit, comprising:
      a ring gate to which a first potential is applied;
      a first impurity diffusion layer formed inside the ring gate;
      a second impurity diffusion layer formed outside the ring gate; and
      a shield electrode formed on a substrate to surround the second impurity diffusion layer and to which a second potential is applied,
   wherein one of the first and second impurity diffusion layers is connected to a circuit to be protected, and another impurity diffusion layer receives the first potential.

2. The semiconductor circuit device according to claim 1, wherein the first potential is a ground potential, and the second potential is one of the ground potential and a power supply potential.

3. The semiconductor circuit device according to claim 1, wherein the first potential is a power supply potential, and the second potential is one of a ground potential and the power supply potential.

4. The semiconductor circuit device according to claim 1, wherein an insulating layer is formed below the first and second impurity diffusion layers.

5. The semiconductor circuit device according to claim 1, wherein a diffusion layer of an opposite conductivity type to the second impurity diffusion layer is formed outside the shield electrode.

6. The semiconductor circuit device according to claim 1, further comprising:
   another protection circuit, comprising:
      a ring gate to which a first potential is applied;
      a first impurity diffusion layer formed inside the ring gate;
      a second impurity diffusion layer formed outside the ring gate; and
      a shield electrode formed so as to surround the second impurity diffusion layer and to which a second potential is applied,
      wherein one of the first and second impurity diffusion layers is connected to a circuit to be protected, and the other of the first and second impurity diffusion layer receives the first potential;
   wherein an insulating layer for electrical isolation is devoid of formation between the protection circuit and the another protection circuit.

7. The semiconductor circuit device according to claim 1, further comprising:
   another protection circuit, comprising:
      a ring gate to which a first potential is applied;
      a first impurity diffusion layer formed inside the ring gate;

a second impurity diffusion layer formed outside the ring gate; and a shield electrode formed so as to surround the second impurity diffusion layer and to which a second potential is applied, wherein one of the first and second impurity diffusion layers is connected to a circuit to be protected, and the other of the first and second impurity diffusion layer receives the first potential;

a first shield electrode between circuits and a second shield electrode between circuits formed between the protection circuit and the another protection circuit; and a diffusion layer of an opposite conductivity type to the silicon layer, formed in the silicon layer between the first shield electrode between circuits and the second shield electrode between circuits.

8. The semiconductor circuit device according to claim 1, wherein the protection circuit and another protection circuit are connected between an external pad and an internal circuitry, further comprising:

two shield electrodes between circuits, positioned between the internal circuitry and the protection circuit, and between the internal circuitry and the other protection circuit; and a diffusion layer of an opposite conductivity type to the silicon layer, formed in the silicon layer between the two shield electrodes between circuits.

9. The semiconductor circuit device according to claim 7, wherein potentials are applied to the first and second shield electrodes between the protection circuit and the another protection circuit so as to collect carriers causing injection between the protection circuit and the another protection circuit.

10. The semiconductor circuit device according to claim 9, wherein potentials are applied to the diffusion layer of an opposite conductivity type to the silicon layer so as to collect carriers causing injection between the protection circuit and the other protection circuit.

11. The semiconductor circuit device according to claim 1, wherein the protection circuit comprises a plurality of said protection circuits connected in parallel.

12. The semiconductor circuit device according to claim 11, wherein the shield electrode is shared by adjacent protection circuits.

13. A semiconductor circuit device, comprising:

a plurality of protection circuits comprising:

a first protection circuit; and a second protection circuit, distinct from the first protection circuit; and a shield electrode for element isolation, formed on a substrate between the first protection circuit and the second protection circuit, such that said device is devoid of an element isolation insulating layer between the first protection circuit and the second protection circuit.

14. The semiconductor circuit device according to claim 13, further comprising:

an external pad and internal circuitry; and the shield electrode being formed between the first protection circuit and internal circuitry.

15. The semiconductor circuit device according to claim 13, wherein in said at least one of said first and second protection circuits in said first imparity diffusion layer is connected to said circuit to be protected, and said second impurity diffusion layer receives the first potential.

16. The semiconductor circuit device according to claim 13, wherein in said at least one of said first and second protection circuits in said second impurity diffusion layer is connected to said circuit to be protected, and said first impurity diffusion layer receives the first potential.

17. The semiconductor circuit device according to claim 13, further comprising:

another shield electrode formed so as to surround the second impurity diffusion layer of said first protection circuit wherein a second potential applied to said shield electrode.

18. The semiconductor circuit device according to claim 13, wherein said first and second protection circuits each comprise:

a ring gate to which a first potential is applied;

a first impurity diffusion layer formed inside the ring gate; and a second impurity diffusion layer formed outside the ring gate, wherein said ring gate and said shield electrode are the same layer.

19. The semiconductor circuit device according to claim 1, wherein said ring gate and said shield electrode comprise the same layer.

20. A semiconductor circuit device, comprising:

a plurality of protection circuits comprising:

a first protection circuit comprising:

a ring gate to which a first potential is applied;

a first impurity diffusion layer formed inside the ring gate; and a second impurity diffusion layer formed outside the ring gate; and a second protection circuit, distinct from the first protection circuit, comprising:

a ring gate to which a first potential is applied;

a first impurity diffusion layer formed inside the ring gate; and a second impurity diffusion layer formed outside the ring gate; and a shield electrode for element isolation, formed between the first protection circuit and the second protection circuit, such that said device is devoid of an element isolation insulating layer between the first protection circuit and the second protection circuit, wherein in at least one of said first and second protection circuits, one of said first and second impurity diffusion layers is connected to a circuit to be protected, and the other of said first and second impurity diffusion layers receives the first potential, wherein said ring gates from said first and second protection circuits and the shield electrodes from said first and second protection circuits are the same layer.

* * * * *